United States Patent [19]
Murphy et al.

[11] Patent Number: 5,438,481
[45] Date of Patent: * Aug. 1, 1995

[54] MOLDED-IN LEAD FRAMES

[75] Inventors: James V. Murphy, Warwick; Michael J. Murphy, East Greenwich, both of R.I.

[73] Assignee: Advanced Interconnections Corporation, West Warwick, R.I.

[ * ] Notice: The portion of the term of this patent subsequent to Dec. 1, 2009 has been disclaimed.

[21] Appl. No.: 64,841

[22] Filed: May 20, 1993

Related U.S. Application Data

[63] Continuation-in-part of Ser. No. 991,978, Dec. 17, 1992, which is a continuation of Ser. No. 121,568, Nov. 17, 1987, Pat. No. 5,184,285.

[51] Int. Cl.⁶ .............................................. H05K 5/02
[52] U.S. Cl. ...................................... 361/813; 439/70
[58] Field of Search ................. 29/827; 174/52.4; 257/668, 672, 678, 697; 361/805, 807, 723, 774, 785, 813; 437/206–207, 217, 220

[56] References Cited

U.S. PATENT DOCUMENTS

| | | | |
|---|---|---|---|
| 3,588,616 | 6/1971 | Palazzini | 317/101 |
| 4,195,193 | 3/1980 | Grabbe et al. | 174/52 |
| 4,278,311 | 7/1981 | Scheingold et al. | 339/17 |
| 4,378,139 | 3/1983 | Griffin et al. | 339/75 |
| 4,381,131 | 4/1983 | Desmnianiuk | 339/75 |
| 4,393,581 | 7/1983 | Cherian | 29/827 |
| 4,497,012 | 1/1985 | Gottlieb et al. | 361/306 |
| 4,504,105 | 3/1985 | Barkus et al. | 339/75 |
| 4,513,355 | 4/1985 | Schroeder et al. | 361/403 |
| 4,521,828 | 6/1985 | Fanning | 361/386 |
| 4,560,216 | 12/1985 | Egawa | 339/12 |
| 4,614,387 | 9/1986 | Hartl | 339/17 |
| 4,677,526 | 6/1987 | Muehling | 361/386 |
| 4,811,167 | 3/1989 | Rippey et al. | 361/392 |
| 5,168,432 | 12/1992 | Murphy et al. | 439/70 |

OTHER PUBLICATIONS

Matsushita Full Line Catalog, "Connectors", 1992, pp. 123, 125–127, 130, 132–133, 138.

Advertisement, Circle EE 9 "Molded Thermoplastic PGA Package" (Date unknown).
Electronics, "How to Make Pin–Grid Arrays at Half the Cost", (Feb. 1987), pp. 36, 40.
Advertisement, AMP, "Premolded Plastics Chip Carrier" (Date unknown).
Autosplice Advertisement, Electronics Packaging & Production (Date unknown).
Werther, "Molded Thermoplastics for Pin–Grid Array Chip Packaging", Photocircuits (May 1986), pp. 267–280.
Tricon Industries Advertisement (Date unknown).
Advertisement, Plasticorp, "3D Circuit Boards" (Date unknown).
Meco, "A Plating Service That Supplied Quality in Quantity Without Increasing Coats" (Date unknown).
Advertisement, Circuits Plus, "Three-dimensional and multilayer molded circuit design" (Date unknown).
Advertisement, Raychem, "SolderQuik Tape" (Date unknown).
AMP Advertisement, 196 Position Micro-Pitch Surface Mount Socket, Jan., 1993.
Pem, "Miniature Self-clinching Fasteners", Bulletin FE-981.

(List continued on next page.)

Primary Examiner—Gregory D. Thompson
Attorney, Agent, or Firm—Fish & Richardson

[57] ABSTRACT

The disclosure features lead frames, molded lead frames and adapters and sockets produced by molding these lead frames. In general, the lead frames comprise a frame and a circuit, wherein the circuit comprises a plurality of electrical conducting elements. The elements are held in position by the frame, and each element comprises an area within the element suitable for positioning a pin through the element to electrically connect the element with the board. The lead frame can be molded in plastic and trimmed to remove the frame to leave each element electrically separate from each other element.

6 Claims, 16 Drawing Sheets

OTHER PUBLICATIONS

Advertisement, Advanced Interconnectioins, "Solder Preform Sockets" (Date unknown).

Murphy, "Sub-Surface Mount Decoupling Capacitor Sockets with New Molded in Circuits", Advanced Interconnections Corp., pp. 595 ∝ 597 (Date unknown).

Kammerer (German Advertisement, date unknown).

Schaper et al., "Improved Electrical Performance Required For MOS Packaging", IEEE Transactions on Components, Hybrids, and Manufacturing Technology, vol. CHMT-6, Sep., 1983, pp. 283-289.

"$\mu$IC Socket", Matsushita Electric Works, Ltd. (Date unkown).

Brochure, Yamaichi Electronics, Inc., pp. 103-106, 125, 128-129, 185, 187—188, 191.

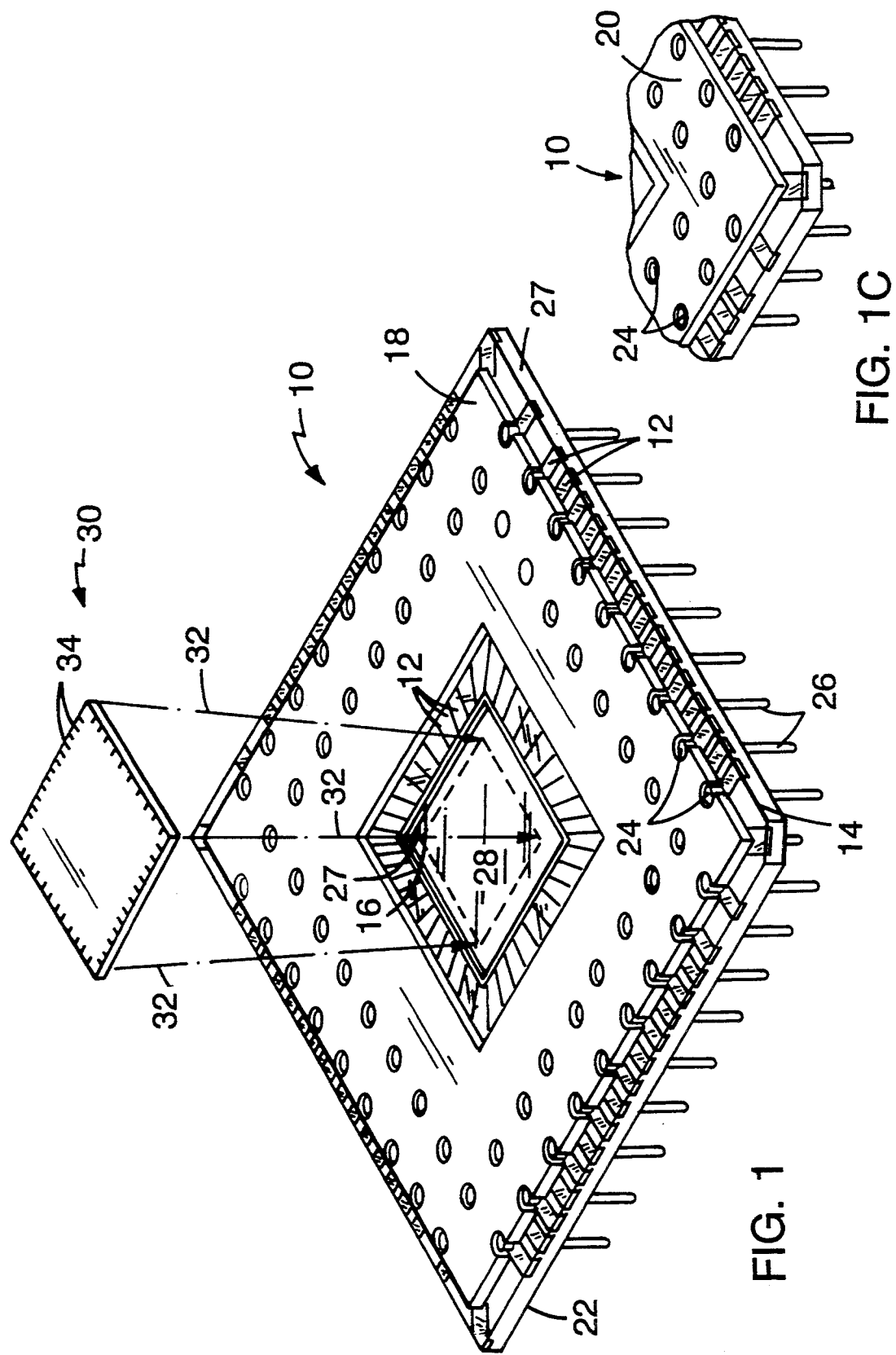

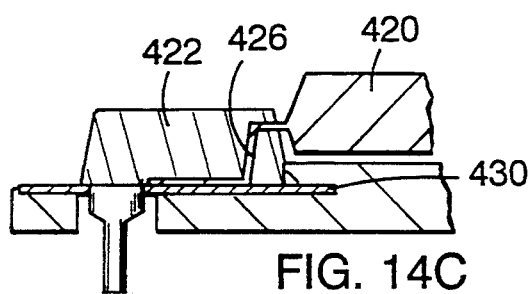
FIG. 14C
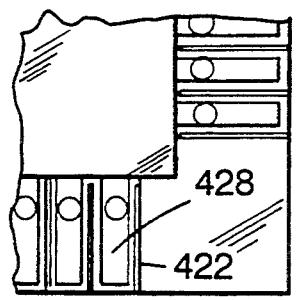
FIG. 14B
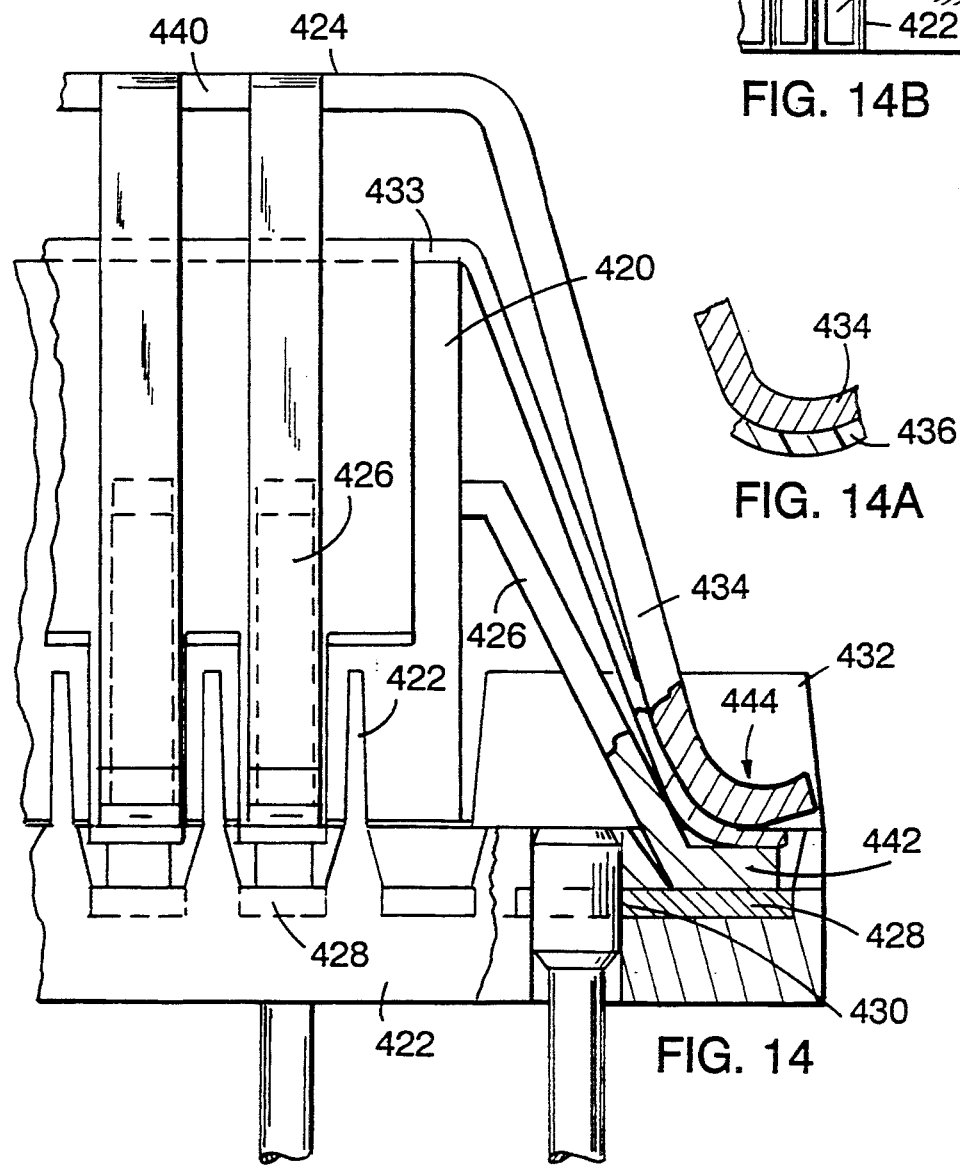
FIG. 14A
FIG. 14

MOLDED-IN LEAD FRAMES

BACKGROUND OF THE INVENTION

This application is a continuation-in-part of U.S. Ser. No. 07/991,978, filed Dec. 17, 1992, which is a continuation of U.S. Ser. No. 07/121,568, filed Nov. 17, 1987, now issued as U.S. Pat. No. 5,184,285.

This invention relates to adapters and integrated circuit (IC) sockets for intercoupling electrical circuit components and terminals for mechanical and electrical connection to external components, such as those on a printed circuit (PC) or wire wrap board.

Adapters and IC sockets are described in Advanced Interconnections Catalog No. 10 (available from 5 Energy Way, West Warwick, R.I. 02893). In general, they consist of a glass epoxy frame having pins which are used to electrically connect a PC board with an IC or other electrical component. They can be used as high density sockets, single-in line or dual-in line sockets, decoupling capacitor sockets, hybrid socket and board connectors, pin grid array sockets, and as J-lead, gull wing and leadless adapters and sockets.

In general, the adapters and IC sockets are manufactured by PC fabrication. Briefly, a glass epoxy laminate having copper on both sides is drilled to produce holes for pins, and then photo-etched to produce the desired circuitry. Copper is then plated through the holes to provide electrical connection for the pins. Metal, such as tin or gold, is then plated on top of the etched copper to enhance its soldering properties. A single adapter is then routed from the laminate and pins mechanically positioned in the holes.

SUMMARY OF THE INVENTION

In one aspect, the invention features an intercoupling component (e.g., adapter or socket) including lead frame elements molded within an insulative plastic body, with each element having a connection region for electrically contacting leads of an integrated circuit package. The molded plastic body has a shape providing a plurality of grooves that are configured to align the leads of the integrated circuit package with the connection regions of the lead frame elements.

In preferred embodiments, the grooves are separated by walls sized and configured to accept J-leads of a J-lead device to prevent the J-leads from coming into contact with more than one lead frame element. Alternatively, the grooves may be configured to prevent shorting between gull-wing leads of a gull-wing device. For adapter embodiments, the leads of the J-lead or gull-wing device may be solder leads permitting soldering to the adapter after the package is placed in the adapter. For socket embodiments, the leads may include particle interconnection contacts to improve the electrical and mechanical reliability of the contact between the lead frame and the chip package.

In another aspect, the invention features a device suitable for aiding in the fastening of an IC package (e.g., a gull-wing package) to an intercoupling component (e.g., an adapter or socket). The device has a plurality of elements each corresponding to a connector lead of the IC package. Each element is positioned over a different connector lead, and the elements convey a downward force on the connector leads to assure good electrical contact of each connector lead with the intercoupling component.

In preferred embodiments, the device includes a means for providing a downward force on a plate member, such as a cover, and the plurality of elements extend from a lead frame formed within the plate member. Each element is cut from the same lead frame and is positioned relative to the other elements in the same general orientation as in the lead frame prior to being cut. Each element includes a contact region sized and positioned for making contact and exerting a downward force on a corresponding one of the plurality of leads of the IC package. The cover includes engagement members received within receiving portions of said adapter to lock or clip the plate member to the adapter.

In other preferred embodiments, each of the elements includes elongated legs attached to an upper surface, and the legs extend from the upper surface to a plane below the surface with each leg touching the plane at a position corresponding to a connector lead. Each leg can be positioned over a different connector lead, and is suitable for exerting a downward force on a corresponding connector lead to allow contact of each connector lead with the adapter. The undersurface of each leg comprises an insulating material.

This invention provides adapters and sockets which are functionally advanced over prior art devices. Since the conducting elements are formed from a lead frame, which may be produced by etching or by stamping out from a sheet of metal, they can be thicker and thus provide lower resistance and inductance than prior art devices. The invention also provides a less costly and more reliable method for making such devices since holes for pins are formed during the molding process and need not be drilled out, nor need copper to be plated through the holes since the lead frame provides adequate electrical connection with the pins.

The devices produced also make it possible to mount capacitors or chips below the upper surface of the device, or even on the undersurface of the device, thus increasing the density at which such chips can be mounted and the physical security of such chips. The invention allows increased accuracy in the positioning of pins and circuitry in the final device, and allows the production of multi-layer devices and reel-to-reel production potential in which a reel of conducting material may pass through stamping, plating, molding, component inserting, terminal inserting, die attaching, wire bonding, lid attaching and assembly inserting stations.

The invention also provides a method for producing sockets and adapters with precisely aligned holes for more accurate connection with sockets and/or boards carrying circuit components. The method avoids the necessity of making printed circuit boards with ceramic substrates and avoids the thermal expansion differential problems of devices produced with such substrates. The method also makes manufacture of such devices quicker and less expensive, and yet allows production of extra features, such as stand-off bumps to aid in cooling off the device or attached chips and cleaning solder flux, and allows ready construction of such devices in three dimensions. Further, the method allows production of multi-layer devices.

Still, further, a flexible insulating strip may carry a number of lead frames through production to facilitate automated production.

Other features and advantages of the invention will be apparent from the following description of the preferred embodiments and from the claims.

BRIEF DESCRIPTION OF THE DRAWINGS

FIGS. 1-9 show various views and embodiments of an adapter package and a flexible insulating strip for supporting lead frames.

FIG. 1 is a perspective view of an adapter carried by a flexible insulating strip and a chip displaced from the adapter; FIG. 1C is a cut-away view of an alternate embodiment of the adapter;

FIG. 2 is a diagrammatic representation of a lead frame;

FIG. 3 is a diagrammatic representation of the upper surface of the adapter;

FIGS. 4, 4a and 5 are generally sectional views of the adapter at sections 4—4 and 5—5, respectively in FIG. 3;

FIG. 6 is a diagrammatic representation of a heat sink;

FIGS. 7 and 7a is a diagrammatic representation of the upper surface of the adapter;

FIG. 8 is a diagrammatic representation of a lead frame having plastic insulating material molded between its elements;

FIG. 9 is an exploded sectional view of an adapter;

FIGS. 14-14C show various aspects of a spider device suitable for fastening a gull-wing package to an intercoupling component;

FIG. 14 is a perspective and partly sectional view of the device held in position over the package;

FIG. 14A is an alternate embodiment of a spider device;

FIG. 14B is a cut-away portion of an intercoupling component suitable for attachment of a gull-wing chip;

FIG. 14C is a partial sectional view of a gull-wing chip attached to an intercoupling component;

DESCRIPTION OF THE PREFERRED EMBODIMENTS

Figure 4:
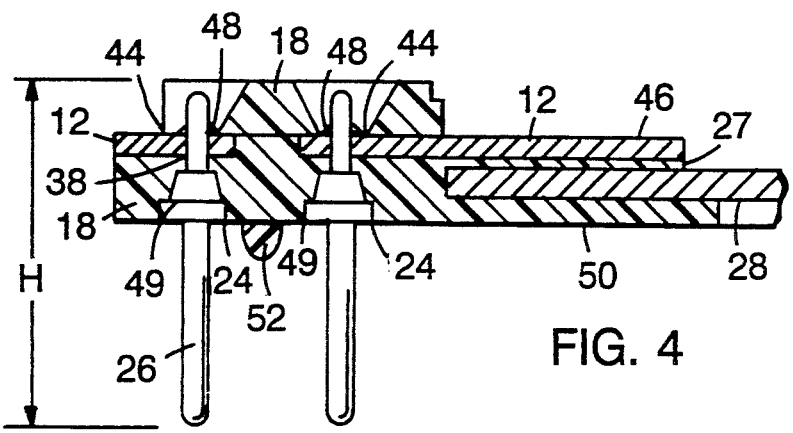

Referring to FIG. 1, adapter 10 is provided with a series of electrically conducting copper elements 12 which run from the outer perimeter 14 of the adapter to the inner perimeter 16. Elements 12 are molded within an electrically insulative material 18, which may typically be LCP, or epoxy, having an upper surface 20 and a lower surface 22. Also provided are holes 24, which pass from upper surface 20 to lower surface 22 and are interrupted to some extent by elements 12 (FIG. 4). Pins 26 are force fit into holes 24 and soldered in place in electrical connection with elements 12. Heat sink and chip carrier 28 is positioned below the level of elements 12 at inner perimeter 16, such that it may conduct heat away from chip 30 when the chip is positioned in adapter 10, as shown by arrows, 32. Heat sink 28 is separated from chip 30 by insulated film 27 attached to elements 12 and heat sink 28 during encapsulation. Chip 30 has electrically conducting elements 34 corresponding in position to elements 12 at the inner perimeter 16 of adapter 10. When chip 30 is correctly positioned, each corresponding element 34 and 12 is wire bonded together, to separately connect each chip conducting element 34 electrically with each pin 26 in adapter 10.

Referring to FIG. 1C, in another embodiment, adapter 10 is molded so that upper surface 20 surrounds each of holes 24.

Figure 1A:
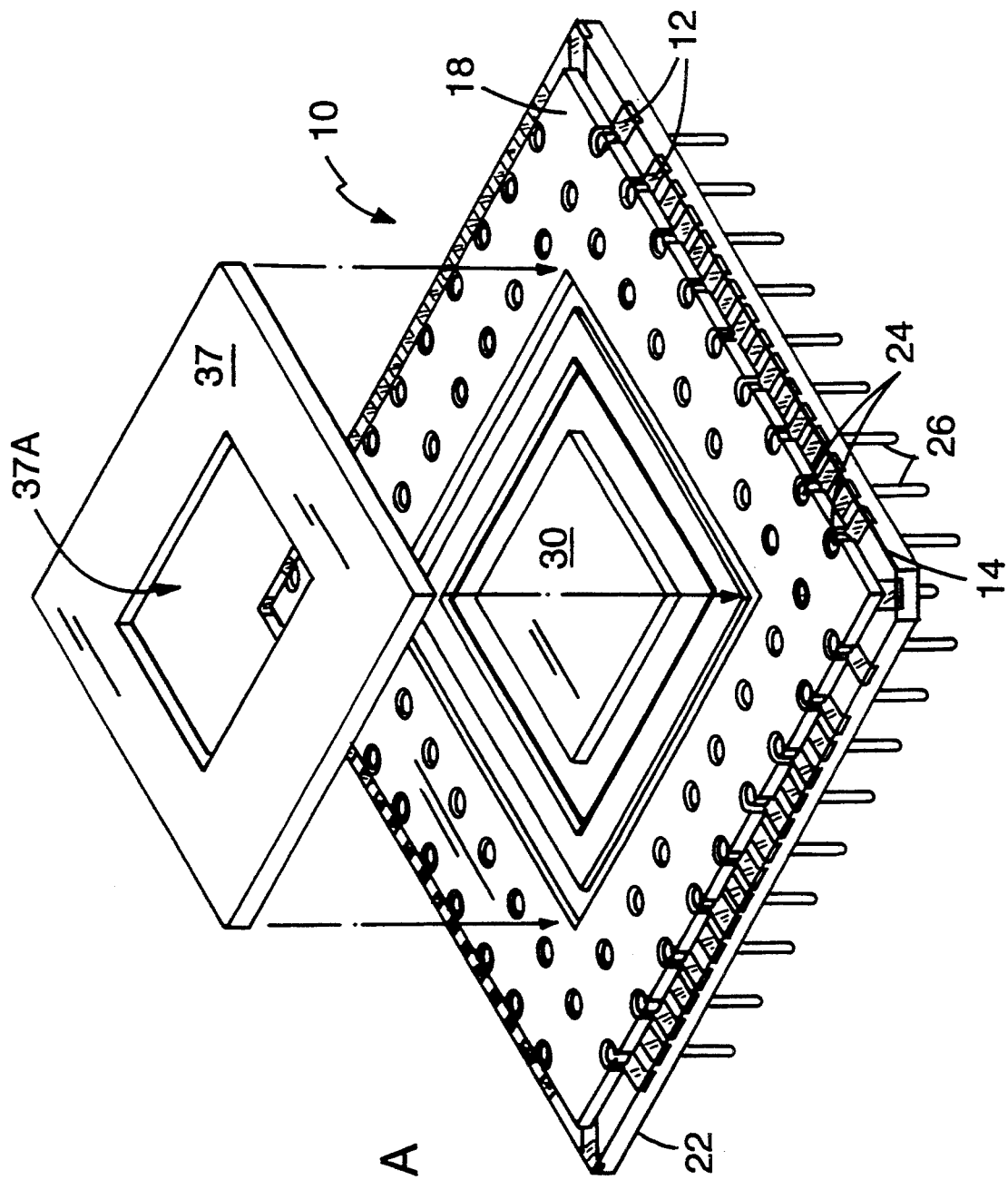
FIGS. 1A, 1B are perspective views of the adapter and covers.
Figure 1B:
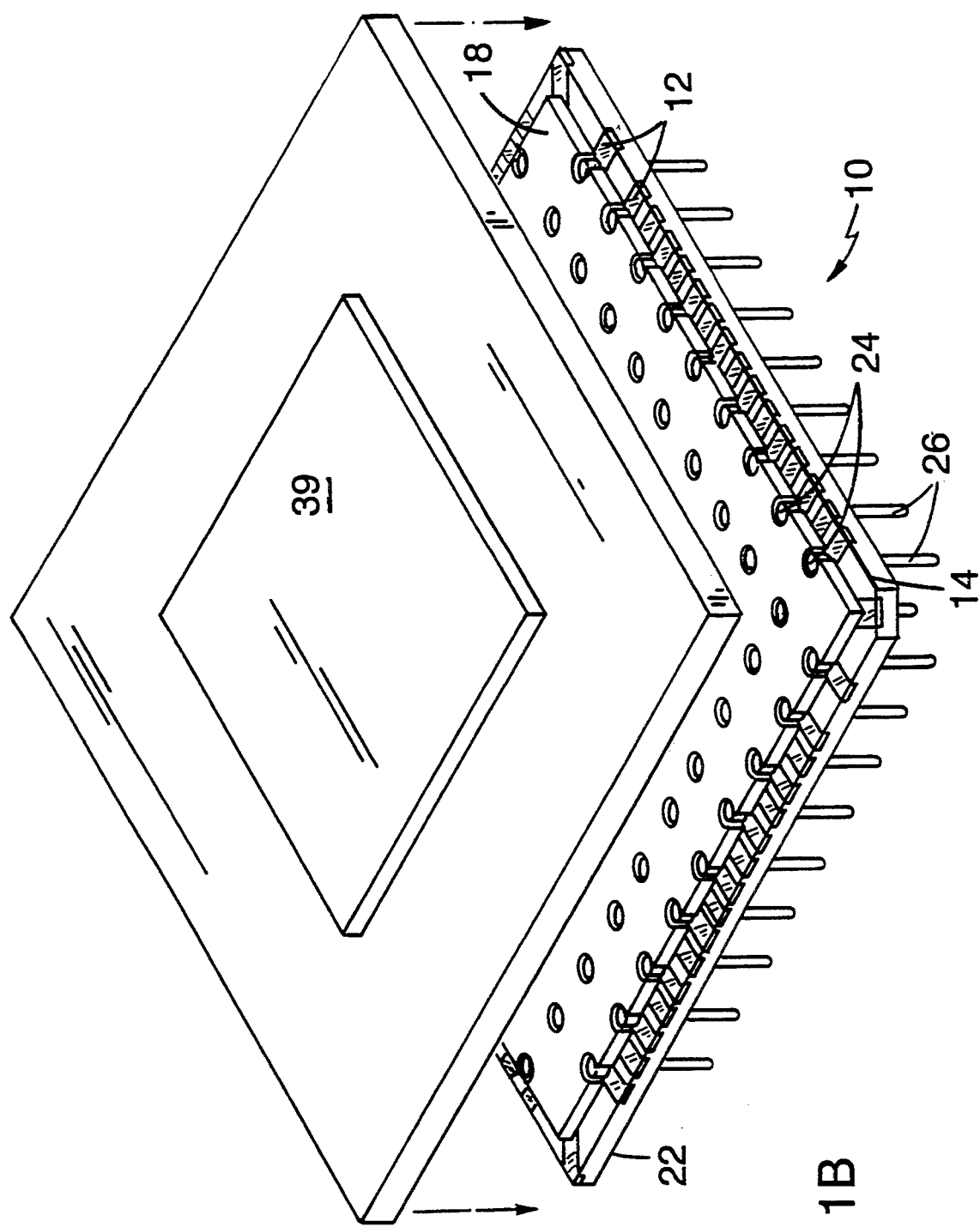

Referring to FIGS. 1A and 1B, two covers 37, 39 and RTU insulating glob (not shown) are provided for adapter 10. Covers 37, 39 protect IC chip 30 or both the chip and adapter, respectively. Smaller cover 37 is particularly useful for allowing circuit testing of the adapter while still protecting IC 30 chip, since pins 26 are accessible from upper surface 20 when the bottom of pins 26 are connected to a circuit. An opening 37A in the small cover 37 allows the RTU insulating glob placed on chip 30 to cure more rapidly.

Figure 2:
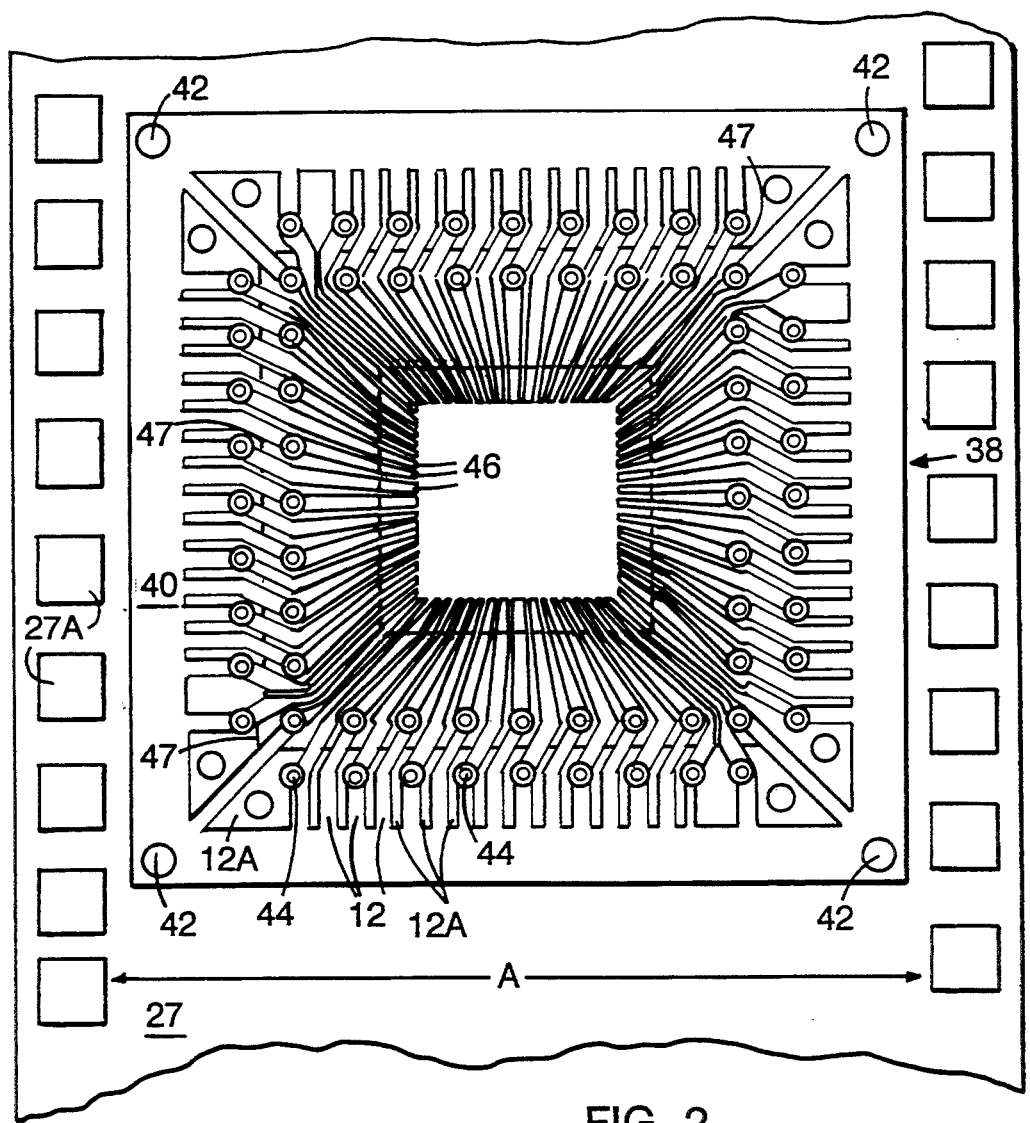

Referring to FIG. 2, a lead frame 38 suitable for forming the adapter of FIG. 1 is shown. The lead frame consists of a square frame 40, having a width A, of about 1.4" at each edge, to which electrical conducting elements 12 are attached. Holes 42 are provided in frame 40 and are used to position the lead frame when it is being molded and attached to insulated film 27 to produce adapter 10. Each element 12 is provided with a hole 44 of diameter about 0.046" through which a pin 26 will be positioned to form adapter 10. Spaces 12A between each element 12 are filled with electrically insulative plastic material using a mold.

The inner shaded length 46 and area around holes 44 of each element 12 is plated with gold for a distance of about 0.06". The inner set of pin holes 44 are separated from the outer set by about 0.1" and may be smaller, 0.05", for example. Other dimensions are apparent from the drawings, which is drawn to scale.

Figure 3:
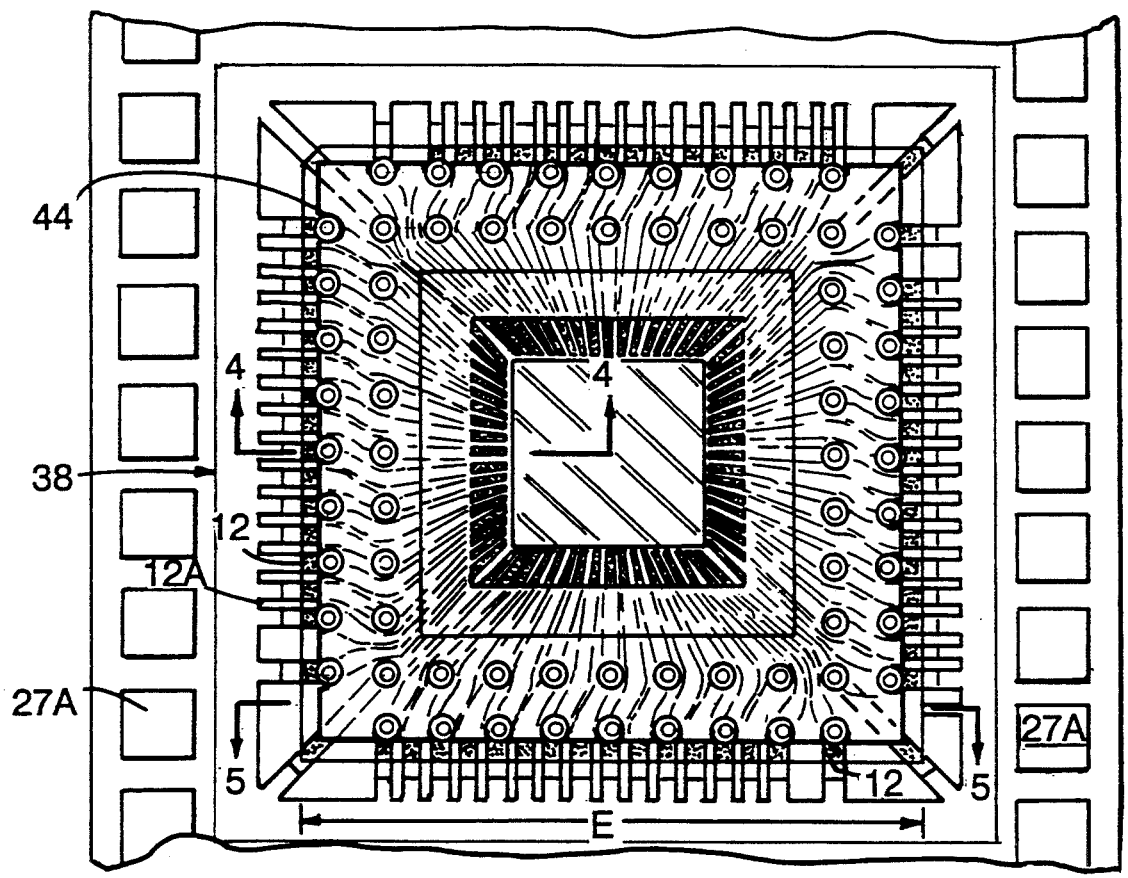

Referring to FIGS. 2 and 3, there is shown a plan view of adapter 10 on insulated film 27. Insulated film 27, which may be mylar or Kapton TM, may be formed with sprocket openings 27A along each edge for engaging sprockets of a drive wheel in an automated system, with film 27 carrying the lead frame and heat sink through the assembly process to a roll of completed adapters. This roll facilitates safe transport, in relatively inexpensive packaging, and dispensing of adapters for use. An inner square area of Kapton TM, shown by dashed lines 47 is removed from Kapton TM area 27 prior to use.

Referring to FIG. 4, adapter 10 has a width E (FIG. 3) of about 1.1" at each edge and is formed from lead frame 38, after trimming to remove frame 40. Pins 26 are positioned through holes 24 in the insulating material 18 and holes 44 in lead frame 38. These pins are force fit into holes 24 and contact elements 12 at these holes. Collars 49, which are an integral part of each pin 26, prevent stress on an element 12 when a pin 26 is bent. Each element 12 is electrically connected with a pin 26. Pins 26 may also be soldered with solder 48 to element 12 at hole 44 which has a diameter of about 0.082". Heat sink 28 is positioned below the level of the wire attach area 46, of element 12, by insulated film 27 glued to elements 12 and heat sink 28. Pins 26 are solid pins of length H, about 0.25", which may be received by holes in a board or socket suitable for carrying circuit components.

Figure 5:
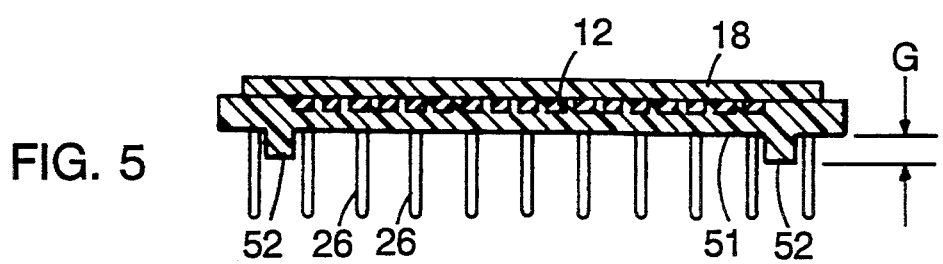
Figure 7A:
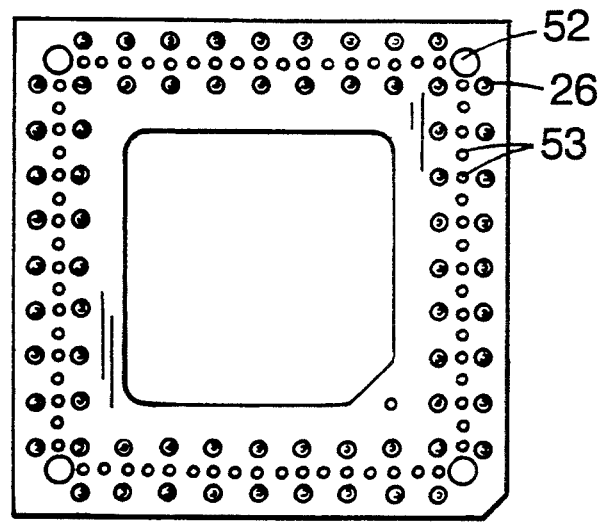
Figure 4A:
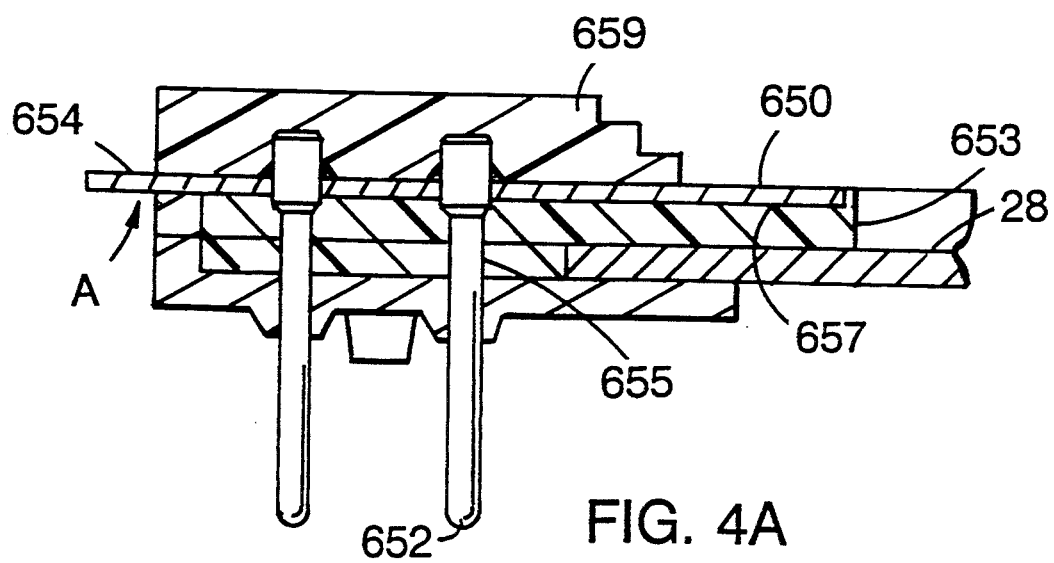

Referring to FIG. 5, the location of stand-off pegs 52 of depth G, about 0.05" on the undersurface of adapter 10, is shown. These pegs are used to ensure correct location of adapter 10 during use. That is, the lower surface 51 of adapter 10 will be 0.05" above the upper surface of a board in which pins 26 of the connected adapter 10 are inserted.

Figure 6:
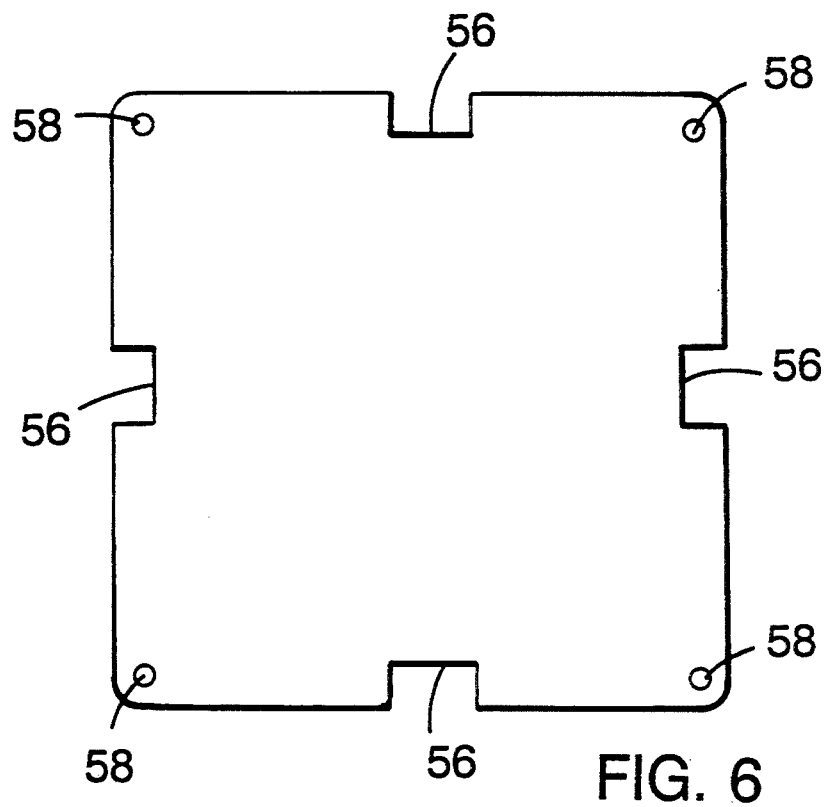
Figure 7:
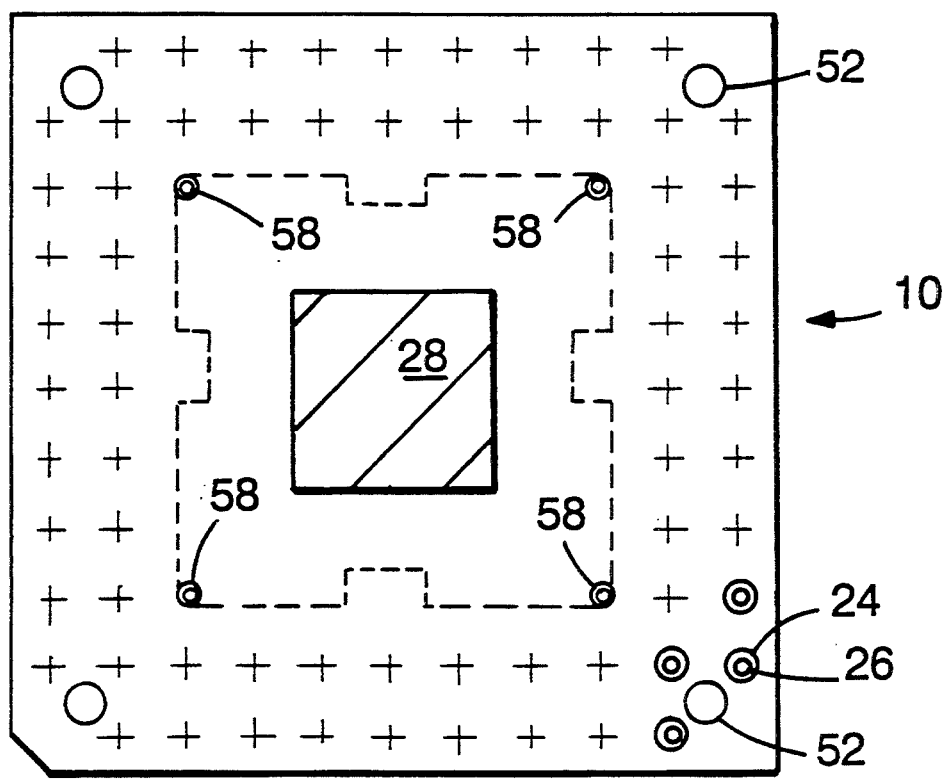

Referring to FIGS. 6, and 7, heat sink 28, which also functions as a site for attaching chip 30, has four holes 58 of about 0.032" diameter. The four holes 58 are used to locate heat sink 28 relative to lead frame 38, during manufacture. Holes 58 may be used to attach heat sink 28 to insulated film 27 with lead frame 38 on the other side of film 27. Heat sink 28 is preferably of a square shape to provide a larger surface area at less expense. Notches 56 are formed along the midportion of each side to help lock heat sink 28 into position when it is molded within adapter 10.

Lead frame 38 is constructed from 102 copper alloy ½ hard, having a thickness of about 0.006" (or 0.012" when used for a double lead frame for greater mechanical strength and improved electrical properties) as one of a set of lead frames in a 12" by 16" metal block, each lead frame being separated by 0.012" gaps. The lead frames can be constructed by standard etching techniques with a 0.002"/side etch factor, or may be stamped out from a metal sheet. It is preferred to plate the lead frame at solder positions with at least 0.0002" bright acid tin, and at regions 46 (where connection to a chip is made) with at least 0.0001" nickel and 0.00005" gold.

Figure 8:
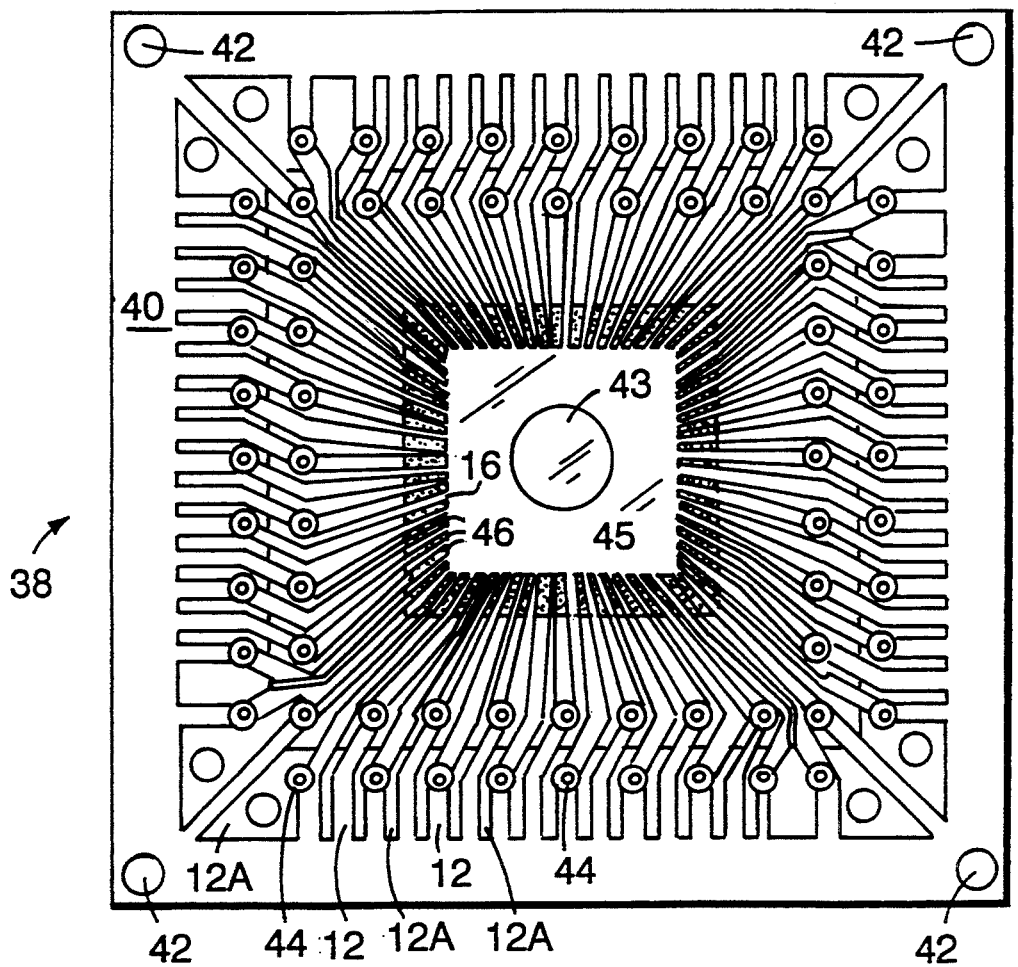
Figure 8A:
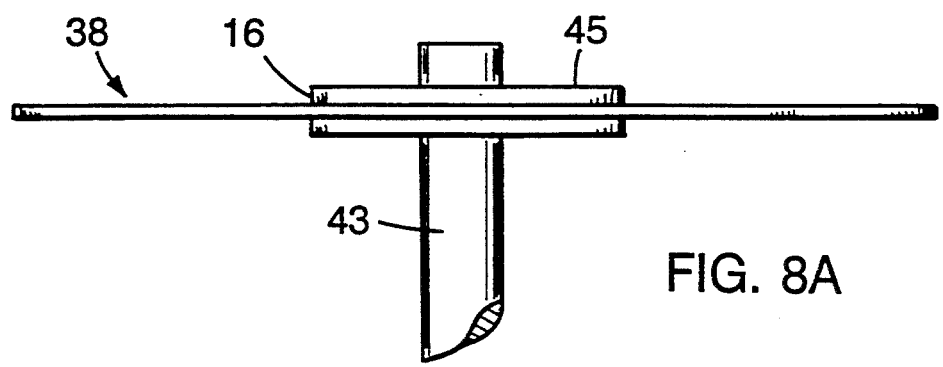
FIG. 8A is a side view of the lead frame of FIG. 8.

Referring to FIGS. 8 and 8A, spaces between each element 12 are filled with electrically insulating plastic material using a mold (not shown). Preferably the mold has projections along the inner perimeter 16 of lead frame 38. A plastic tube 43 may then be inserted through inner perimeter 16 and insulating material injected into spaces 12A using conventional molding processes, generally called a first shot molding process. Excess plastic 45 along inner perimeter 16 is removed and lead frame 38 is placed on Kapton TM film 27. Lead frame 38 is centered over a hole defined by lines 47 in film 27 using holes 42 to properly align the lead frame (FIG. 3). Both Kapton TM film 27, which as a layer of glue, and lead frame 38 are heated to melt the glue to attach lead frame 38 to Kapton TM film 27. The next step in the fabrication process is called a second shot molding process. During this step heat sink 28 is attached to lead frame 38 and insulative plastic molded around lead frame 38, film 27 and heat sink 28.

Heat sink 28 is constructed from 110 E.T.P. copper alloy ½ hard, of thickness about 0.02", by standard etching techniques with a 0.002"/side etch factor, or by stamping out from a metal sheet. They are made on a 12" by 16" sheet with about 0.05" spacings. The copper is plated with at least 0.0002" bright acid tin, and at solder joints around holes 58 with at least 0.0001" nickel and 0.00005" gold.

The lead frame 38 and heat sink 28 are molded into electrically insulative plastic material LCP using a mold which has projections positioned above and below holes 44 in lead frame 38 and with projections to hold holes 42 of the lead frame and holes 58 of heat sink 28 in appropriate positions. To electrically insulate the elements from the heat sink, plastic material is allowed to fill an area between heat sink 28 and lead frame 38 prior to the second shot molding process. Further, the mold prevents accumulation of plastic above the heat sink and within the inner perimeter of the adapter and an area about the inner and outer edges of each element 12, as shown in FIG. 3.

After molding, frame 40 of lead frame 38 is electrically isolated from elements 12 so that tests can be performed to test the electrical independence of each element 12. Frame 40 is isolated from elements 12 by punching out a small segment of each element 12 leaving a web of film 27 to support lead frame 38. Pins 26 are thereafter inserted through each hole 24 and 44, shown in FIGS. 2 and 3, respectively. Each pin is friction fitted in place and soldered in contact with elements 12. Alternatively electrical checks may be run prior to pin insertion, using a free test pin. Finally, a chip 30 and a cover 37 are placed over heat sink 28 and glued in place. An advantage of the above-described reel-to-reel manufacture is that the adapters formed may be tested for electrical continuity while on film 27. Faulty adapters may be removed from film 27, while other adapters are completed.

Figure 9:
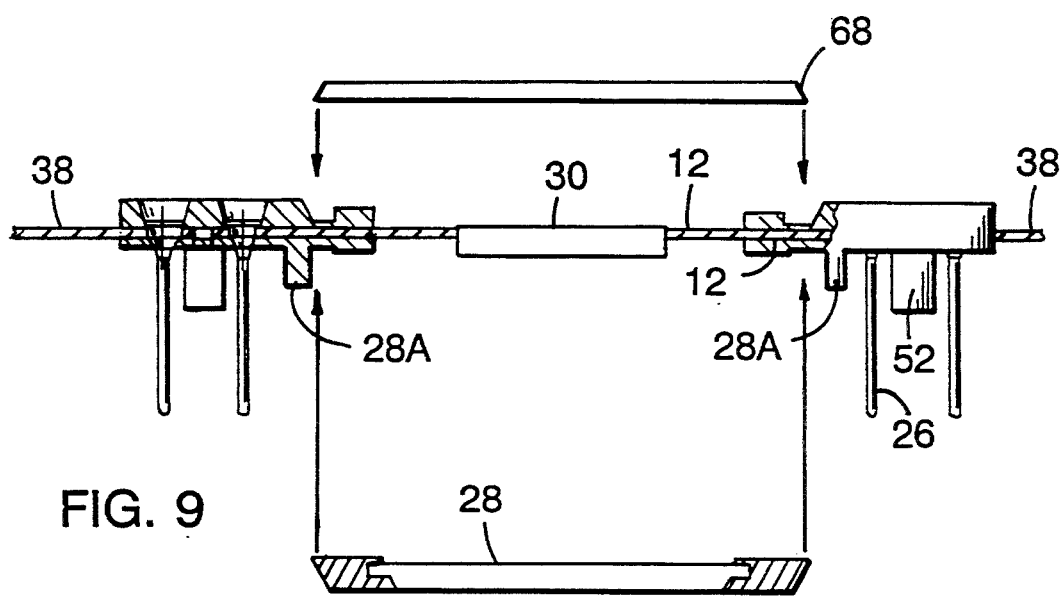
Figure 9A:
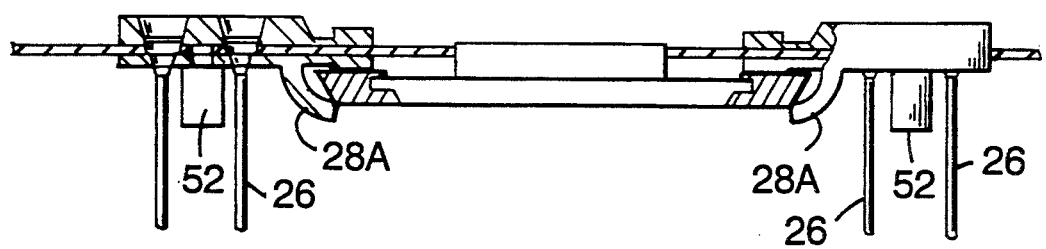
FIG. 9A is a diagrammatic representation of the lower surface of an alternate embodiment of the adapter.

In an alternative method, shown in FIGS. 9 and 9A, lead frame 38 and heat sink 28 may be separately molded and connected together by molding tabs 28A around heat sink 28. Also shown is a cover 68 placed over chip 30 to prevent its dislodgement, and to protect it from environmental factors.

The above described method of manufacture can be used to produce devices, such as the adapter described, and also to produce most of the known and used adapters and sockets, for example, those described by Advanced Interconnections, cited above. Specifically, the method can be used to form adapters for surface mounting of chips, plastic molded pin grid arrays for packaging chips, decoupling capacitor sockets, leadless chip carriers, and in fact almost any circuit can be molded as described above. It is also possible to use this method to produce devices having electrical leads, formed from a lead frame, which can be bent around the molded plastic to lie on the outer perimeter surface of an adapter, rather than on the upper surface of the adapter. The devices produced can be used in the same way as equivalent prior art devices.

Figure 10B:
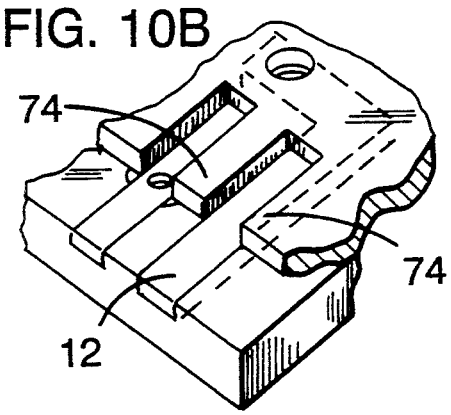
FIGS. 10, 10A and 10B are diagrammatic sectional views of adapters suitable for accepting J-lead chips.
Figure 10:
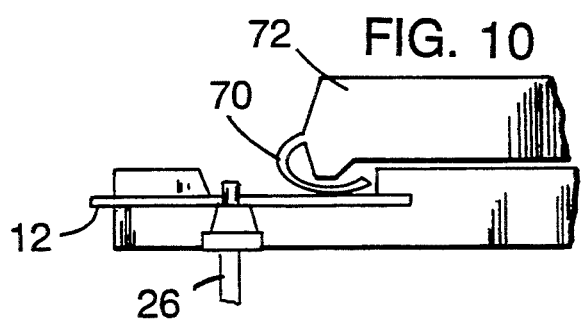
Figure 10A:
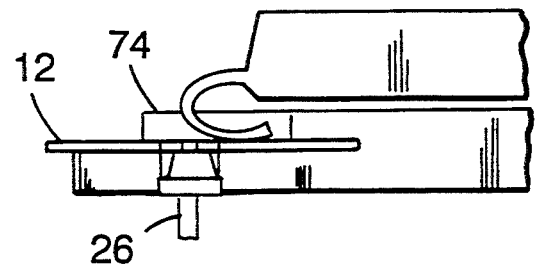

Another embodiment is shown in FIG. 10. An adapter may be constructed such that element 12 is exposed sufficiently to be soldered to a J-lead chip carrier 72. J-lead 70 of chip 72 is thus electrically connected to element 12 and then to a board via pin 26. In FIGS. 10A and 10B is shown another embodiment of an adapter having walls 74 which prevent J-leads from contacting more than one element 12, which prevent solder from spreading from one element to another, and which allow inspection of the solder joint. The adapter of the invention may be readily constructed to accommodate other shaped leads on chips, using the above described techniques.

Figure 11:
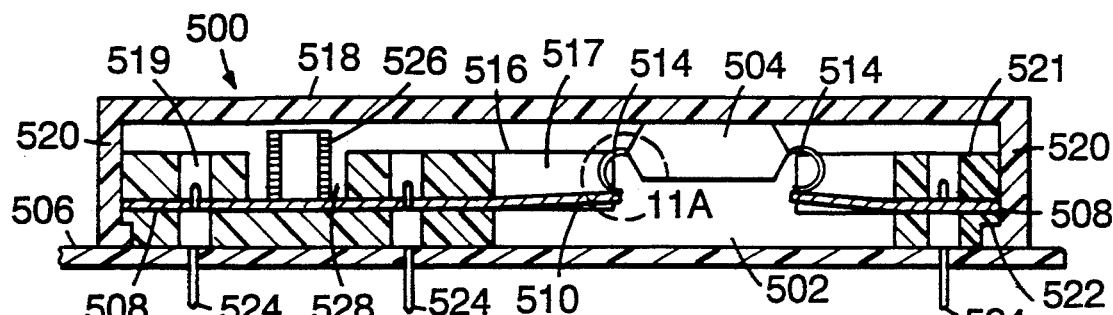
FIG. 11 is a cross sectional side view of a socket embodiment of the invention for supporting a J-lead chip package.

The invention also can be applied to sockets, in which solderless connections are provided between an IC package and a printed circuit board. FIGS. 11-12 show a socket 500 supporting a J-lead chip carrier (FIG. 12 shows the socket with the chip package and cover removed from the socket). The socket 500 connects a packaged chip 504 to a printed circuit board 506. The socket includes an aperture 502 in which chip 504 is disposed. Socket 500 is fabricated from an electrically insulative plastic and includes a molded-in lead frame 508. Lead frame 508 is provided in the manner described above in conjunction with FIG. 2 and includes a series of electrically conductive copper elements 510 extending from the outer perimeter of socket 500 to the outer perimeter of aperture 502. End portions of elements 510 extend within aperture 502 to provide reed-like spring members 512 (FIG. 11A) for contacting connector leads 514 of chip 504. Socket 500 further includes alignment grooves 517 along the periphery of aperture 502 to align and prevent shorting between adjacent connector leads 514. Ribs or walls 516 define the grooves 517. When packaged chip 504 is properly positioned within socket 500, each connector lead 514 aligns and electrically contacts a corresponding conductive element of lead frame 508.

A locking cover 518 placed over packaged chip 504 provides the downward force necessary to maintain mechanical contact between connector leads 514 and spring members 512. Cover 518 includes L-shaped legs 520 along its outer edge which extend downward to engage and lock with a bottom surface 522 of socket 500.

Socket 500 also includes holes 519 which pass from an upper surface 521 to a bottom surface 522 of socket 500 and are interrupted to some extent by elements 510. Each element 510 is electrically connected to a connector pin 524 force fitted within holes 519. Pins 524 are the same as those described above in conjunction with FIG. 4.

Surface mounted capacitors 526 are also shown disposed within receptor holes 528 of socket 500 to permit connection between preselected conductive elements 510.

Figure 11A:
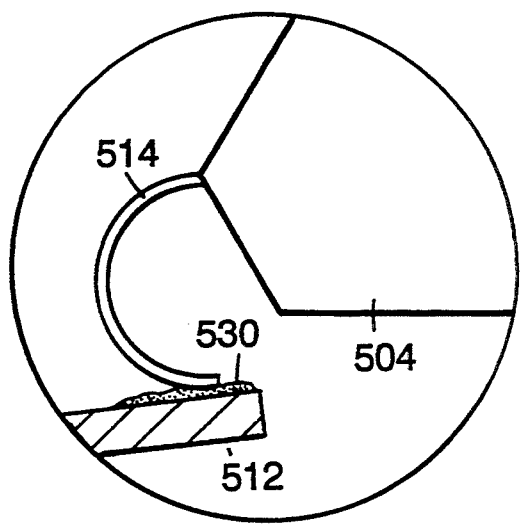
FIG. 11A is a side view of a portion of FIG. 11 taken along lines 11A—11A.
Figure 12:
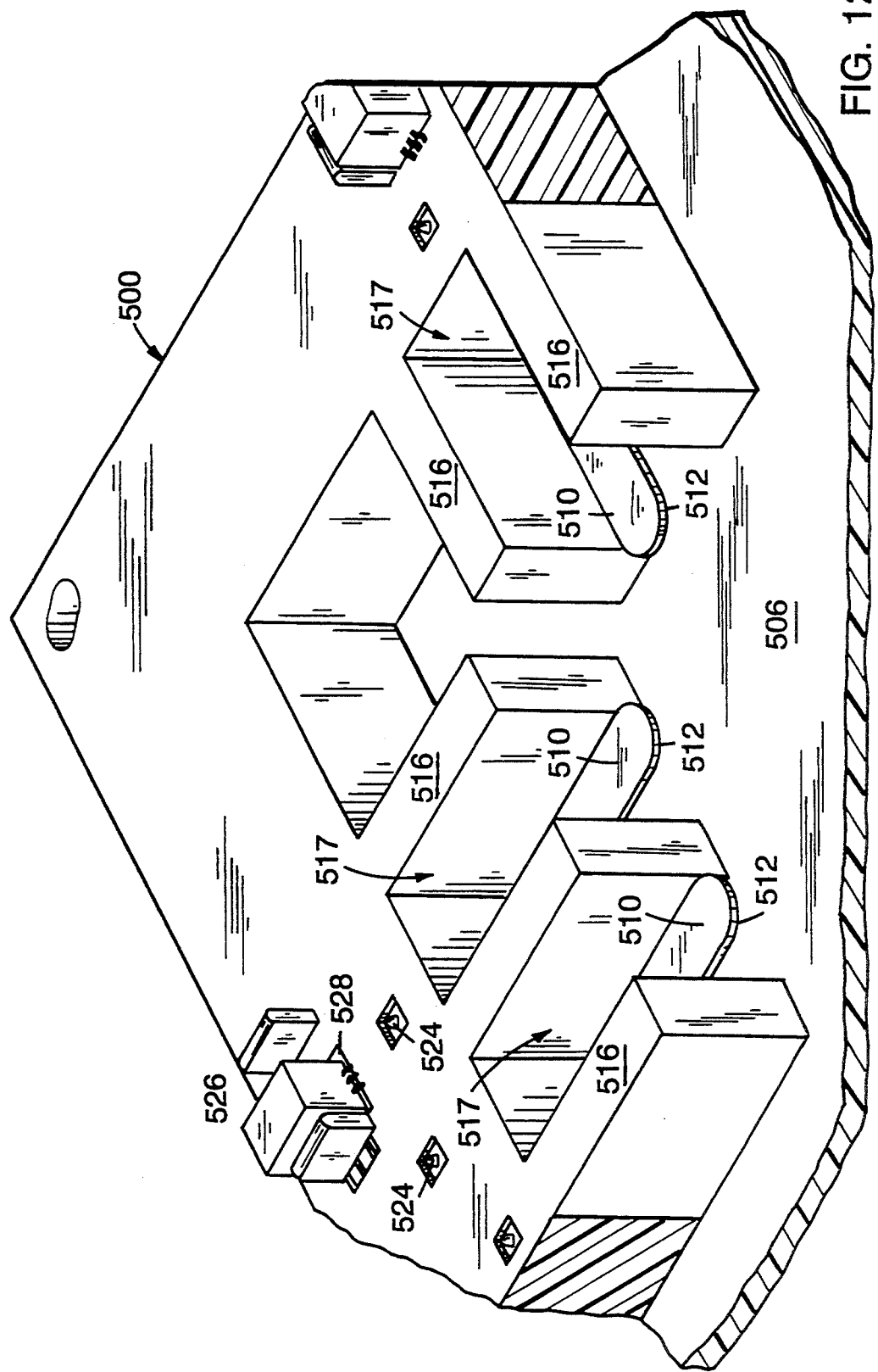
FIG. 12 is a perspective view of a portion of the socket of FIG. 11.

Referring to FIG. 11A, spring members 512 may include particle interconnection (PI) contact surfaces 530. As is described in U.S. Pat. No. 5,083,697 (incorporated by reference), particle interconnection contacts include relatively hard metallized particles deposited in a soft metal layer such that they protrude from the surface of a contact. When a second contacting surface (e.g., connector lead) is compressively brought into contact with the PI contact, the hard particles penetrate any oxides and contamination present on the contacting surface. PI contacts minimize the resistance between the contacts, particularly after repeated insertions.

Figure 13:
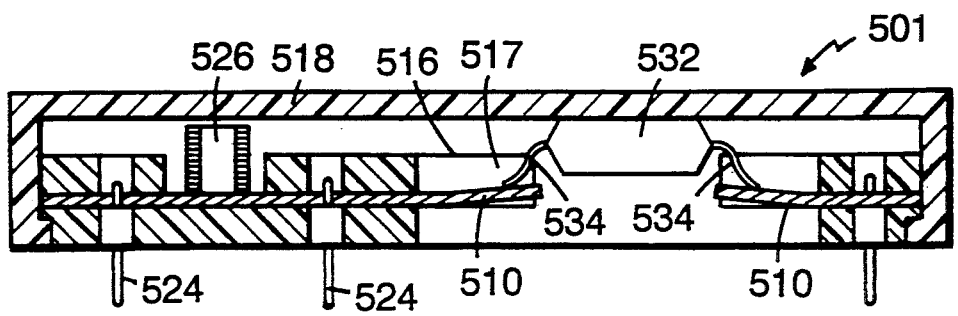
FIG. 13 is a cross-sectional side view of another socket embodiment of the invention supporting a gull-wing chip package.

As mentioned above, the intercoupling components of the invention may be configured to accommodate chip packages having leads of various shapes. For example, referring to FIG. 13, a socket 501, similar to socket 500, is shown supporting a chip package having gull-wing connector leads.

Referring to FIGS. 14–14C, in order to aid in soldering a gull-wing chip 420 to an adapter 422 a spider device 424 is used. Gull-wing chip 420 has connector leads 426 which are to be soldered to leads 428 of lead frame 430. Adapter 422 is provided with ridges 432 between each lead 428 to prevent shorting of the leads. Between spider 424 and connector leads 426 is placed a sheet of Kapton™ 433 which prevents direct contact of metal spring spider legs 434 and leads 426. This sheet may be replaced by a piece of other suitable insulator 436, such as epoxy glue, attached directly to the ends of each spider leg 434, as shown in FIG. 14A. Each connector lead 426 has a piece of Kapton™ placed above it, and then a spider leg is contacted with this Kapton™. The spider device 424 is constructed of a springy material such as stainless steel so that pressure on its upper surface 440 is transferred to legs 434 to exert pressure directly downward onto leads 426 at their ends 442, as shown by arrow 444. In this way leads 424 do not splay out of contact with lead frame 430, or move to touch adjacent leads. Thus, this spider device 424 assures contact of gull-wing leads with conductors in the lead frame. The Kapton™ may be replaced by insulating paint sprayed, screened, or dipped onto the ends of spider legs 434.

Figure 15:
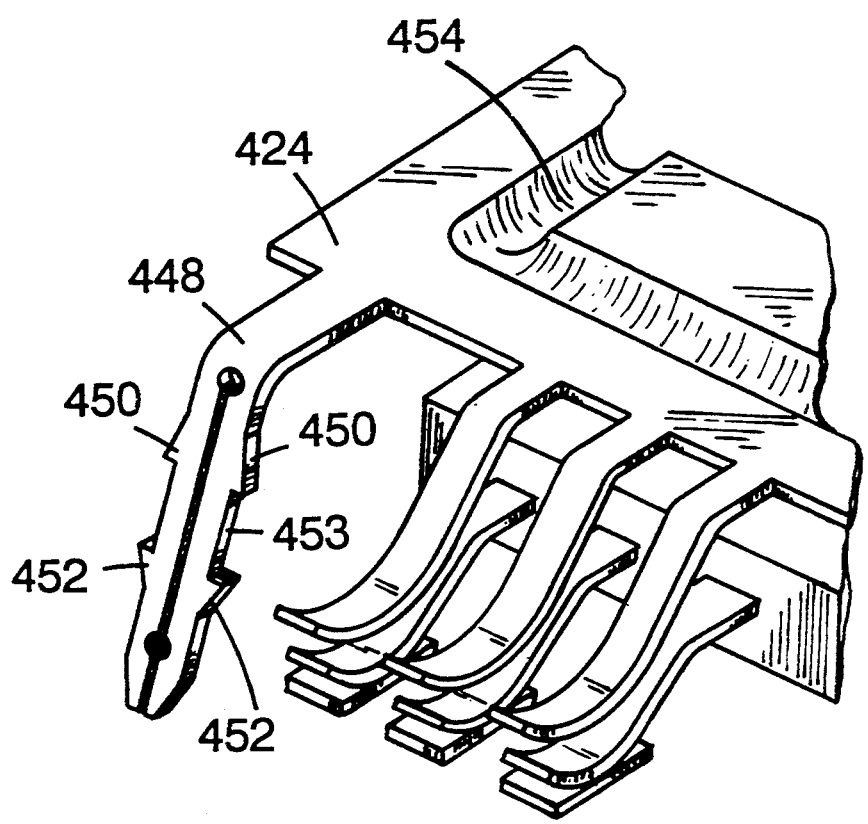
FIG. 15 is a partial sectional view of a leg of the gull-wing chip device.

Referring to FIG. 15, spider leg 448, which is used to hold spider device 424 in place on a PC board (not shown), is bifurcated along its length. Upper hooks 450 and lower hooks 452, separated by a neck section 453 having a length equal to the thickness of the PC board, are formed along the sides of leg 448. When leg 448 is inserted into a hole of the PC board, lower hooks 452 are compressed toward each other and may be clipped to the bottom side of the board. To release spider device 424 from the PC board upper hooks 450 are compressed together, thereby releasing lower hooks 452. Spider device 454 is reinforced by a channel 454 along the perimeter of the device.

Figure 16:
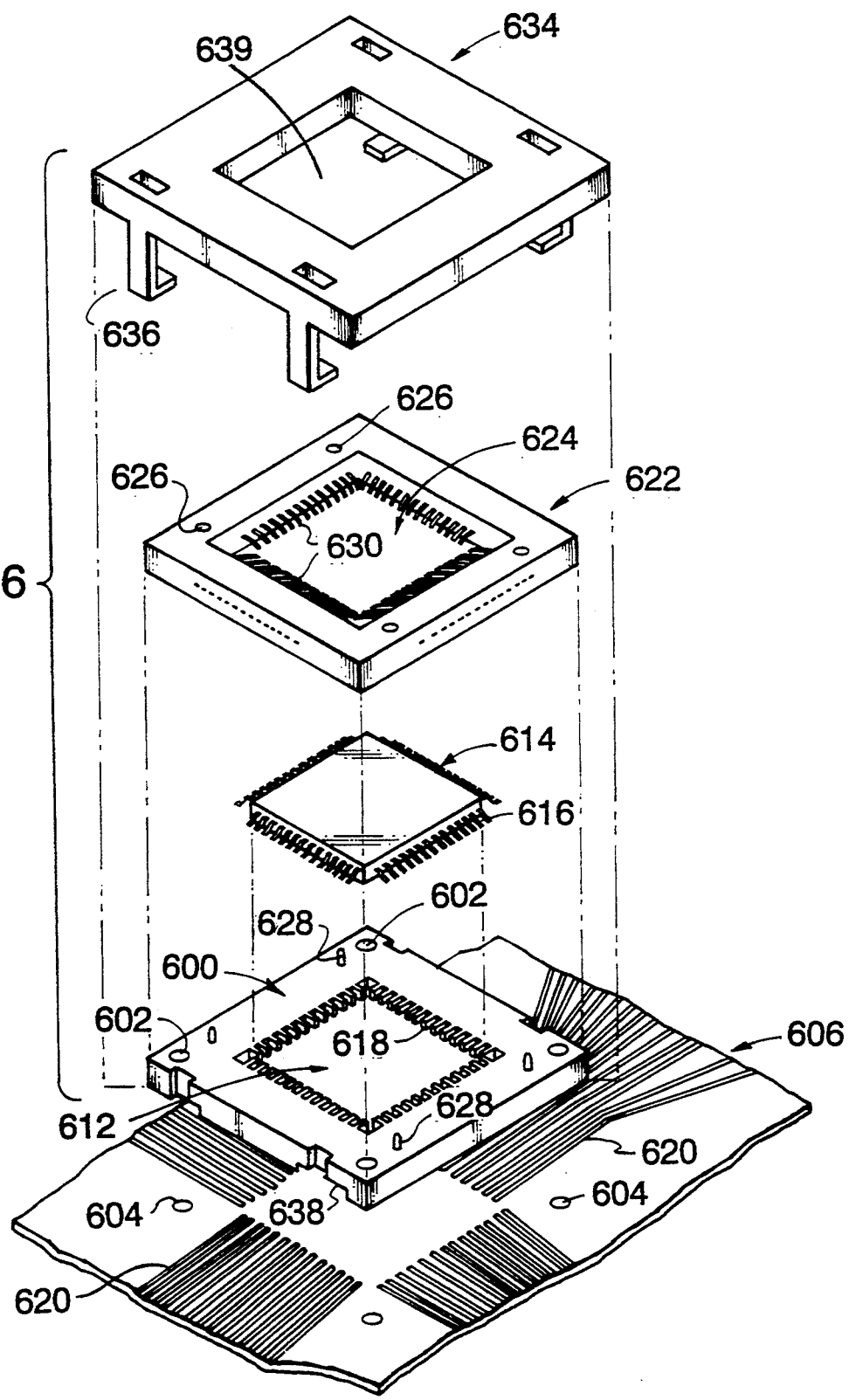
FIG. 16 is an exploded, somewhat diagrammatic, isometric view of another embodiment of the invention, a socket for a gull-wing package.
Figure 17:
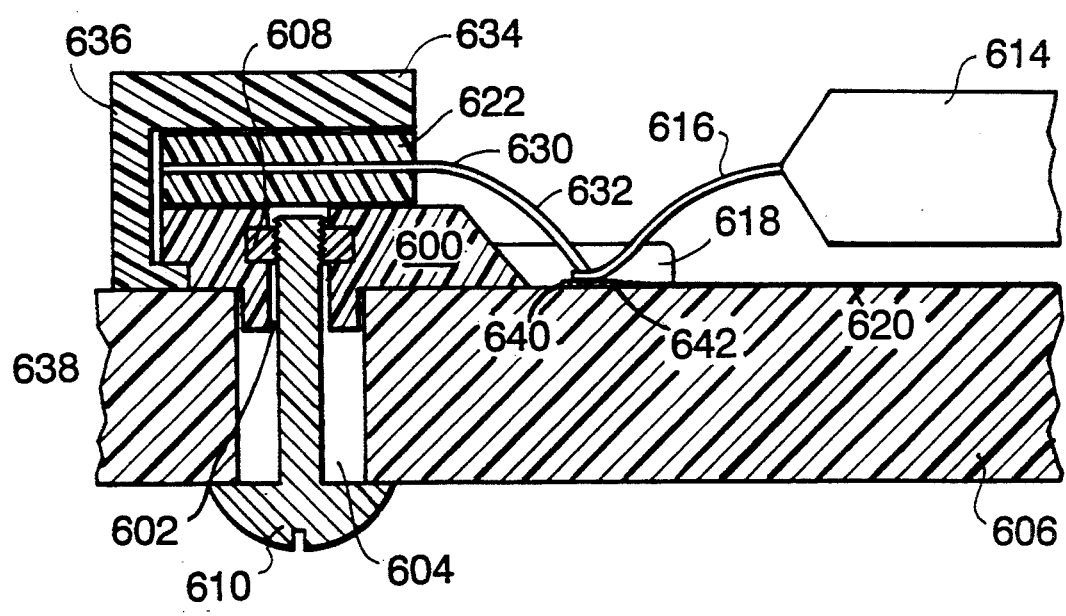
FIG. 17 is sectional view of a portion of the socket of FIG. 16.

FIG. 16–17 show a socket embodiment of this aspect of the invention. A locating plate 600 includes holes 602 for alignment with holes 604 of a printed circuit board 606. As shown in FIG. 17, each hole 602 includes a molded-in nut 608 for allowing a screw 610 to pass through holes 602, 604 and secure locating plate 600 to printed circuit board 606. Locating plate 600 further includes an aperture 612 for receiving a gull-wing packaged chip 614 with gull wing connector leads 616. Aperture 612 includes ribs or walls 618 equally spaced along its outer periphery to align and prevent shorting between adjacent connector leads 616. When properly positioned within locating plate 600, each connector lead 616 aligns and electrically contacts a corresponding conductor 620 of circuit board 606.

Positioned over locating plate 600 is a spring plate 622 fabricated from an electrically insulative material such as LCP or epoxy and having an aperture 624 centered over aperture 612 and chip 614. Spring plate 622 includes holes 626 which mate with alignment pins 628 of locating plate 600 to align spring plate 622 with locating plate 600. Electrically conductive copper elements 630 extend from the outer perimeter of spring plate 622 to the inner perimeter of aperture 624 and are provided within plate 622 as a lead frame, in the manner described above in conjunction with FIG. 2. Upon removal of the outer frame (not shown) of the lead frame, each element 630 is electrically isolated from other elements (thereby obviating the Kapton insulating layer 433 in the embodiment of FIG. 14). Each element 630 has a cantilevered end portion 632 extending into aperture 624 having a downwardly curved shape. Thus, when spring plate 622 is properly positioned over both locating plate 600 and gull-wing chip 614 and a downward force is applied to spring plate 622, each end portion 632 exerts a downward force on a corresponding connector lead 616 of the chip. In this way, a mechanically secure and electrically reliable contact is provided between each connector lead 616 and element 630.

A locking cover 634 placed over spring plate 622 is used to provide the necessary downward pressure to elements 630. Cover 634 includes L-shaped legs 636 positioned along the outer perimeter and from the bottom surface of cover 634 which extend downward to engage mating slots 638 disposed along the outer edge of locating plate 600. Slots 638 are L-shaped such that legs 636 are positioned within the slots and then slid forward to firmly secure cover 634 to locating plate 600. Cover 634 includes an aperture 639 to allow visual inspection of gull-wing chip 614 when locked in place.

As shown in FIG. 17, particle interconnection contact surfaces 640, as described above in conjunction with FIG. 11A, are provided to contact portions 642 of conductors 620 of circuit board 606 to improve the electrical contact between elements 630 and conductors 620.

Other embodiments are within the following claims.

What is claimed is:

1. An intercoupling component for connection of an integrated circuit package to a circuit board, the package being of the type having a plurality of leads which are placed on said intercoupling component, said intercoupling component comprising a plurality of pins for connection to the circuit board, a plurality of lead frame elements, each said lead frame element being cut from the same lead frame and position relative to other said lead frame elements in the same general orientation as in the lead frame prior to being cut, each said pin being individually secured to a said lead frame element and each said lead frame element including a connection region sized and positioned for making a connection to one of the plurality of leads of the integrated circuit package, and insulative plastic molded around said pins and said lead frame elements to form a molded plastic body, the molded plastic body having a shape providing a plurality of grooves that are adapted to serve in aligning the leads of the integrated circuit package with said connection regions.

2. The adapter of claim 1 wherein said grooves are separated by walls sized and configured to accept J-leads of a J-Lead package to prevent the J-leads from coming into contact with more than one lead frame element.

3. The adapter of claim 1 wherein said grooves are separated by walls sized and configured to accept gull-wing leads of a gull-wing package to prevent the gull-wing leads from coming into contact with more than one lead frame element.

4. The adapter of claim 1 wherein said connection regions of each lead frame element include particle interconnection contacts.

5. The adapter of claim 2 wherein said lead frame elements are adapted to accept J-leads which are soldered to the adapter after the package is placed on the adapter.

6. The adapter of claim 3 wherein said lead frame elements are adapted to accept gull-wing leads which are soldered to the adapter after the package is placed on the adapter.

* * * * *